United States Patent
Lee et al.

(10) Patent No.: US 7,868,384 B2
(45) Date of Patent: Jan. 11, 2011

(54) HIGH-VOLTAGE SEMICONDUCTOR DEVICE AND METHOD OF FABRICATING THE SAME

(75) Inventors: Jae-gil Lee, Gyeonggi-do (KR); Chang-wook Kim, Gyeonggi-do (KR); Ho-cheol Jang, Gyeonggi-do (KR); Chong-man Yun, Seoul (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 208 days.

(21) Appl. No.: 11/939,264

(22) Filed: Nov. 13, 2007

(65) Prior Publication Data

US 2008/0111207 A1    May 15, 2008

(30) Foreign Application Priority Data

Nov. 15, 2006    (KR) .................. 10-2006-0113032

(51) Int. Cl.
*H01L 29/66* (2006.01)
(52) U.S. Cl. ............... 257/342; 257/341; 257/E29.024
(58) Field of Classification Search ............ 257/341, 257/342, E29.024, E29.257, E29.262, E29.313, 257/E21.41, E21.629, 401
See application file for complete search history.

(56) References Cited

U.S. PATENT DOCUMENTS

| | | | |
|---|---|---|---|
| 5,216,275 A | 6/1993 | Chen | |
| 5,438,215 A | 8/1995 | Tihanyi | |
| 5,885,878 A | 3/1999 | Fujishima et al. | |
| 6,040,600 A | 3/2000 | Uenishi et al. | |
| 6,171,935 B1 | 1/2001 | Nance et al. | |
| 6,184,555 B1 | 2/2001 | Tihanyi et al. | |
| 6,201,279 B1 | 3/2001 | Pfirsch | |
| 6,630,698 B1 | 10/2003 | Deboy et al. | |
| 6,639,260 B2 | 10/2003 | Suzuki et al. | |
| 6,649,459 B2 | 11/2003 | Deboy et al. | |
| 6,677,626 B1 | 1/2004 | Shindou et al. | |
| 6,683,347 B1 | 1/2004 | Fujihira | |
| 6,693,323 B2 | 2/2004 | Sato et al. | |
| 6,696,728 B2 | 2/2004 | Onishi et al. | |
| 6,713,813 B2 | 3/2004 | Marchant | |
| 6,724,042 B2 | 4/2004 | Onishi et al. | |
| 6,818,513 B2 | 11/2004 | Marchant | |
| 6,825,514 B2 | 11/2004 | Deboy et al. | |
| 6,903,418 B2 | 6/2005 | Iwamoto et al. | |
| 6,960,798 B2 | 11/2005 | Deboy et al. | |
| 7,170,119 B2 | 1/2007 | Yamauchi et al. | |
| 7,224,027 B2 * | 5/2007 | Blanchard | 257/342 |
| 2002/0088990 A1 | 7/2002 | Iwamoto et al. | |
| 2003/0132450 A1 | 7/2003 | Minato et al. | |
| 2003/0209750 A1 | 11/2003 | Deboy et al. | |
| 2003/0222327 A1 | 12/2003 | Yamaguchi et al. | |
| 2005/0250322 A1 | 11/2005 | Aida et al. | |
| 2006/0197152 A1 * | 9/2006 | Tokano et al. | 257/341 |
| 2007/0001230 A1 | 1/2007 | Lee et al. | |

\* cited by examiner

*Primary Examiner*—Matthew C Landau
*Assistant Examiner*—Jessica Hall
(74) *Attorney, Agent, or Firm*—Townsend and Townsend and Crew LLP

(57) ABSTRACT

A high-voltage semiconductor device includes a semiconductor layer having a plurality of pillars of a first conductivity type defined by a plurality of trenches which extend from a top surface of the semiconductor layer toward a bottom surface thereof. A charge compensation layer of a second conductivity type is disposed over at least sidewalls of each trench to a predetermined thickness to form a groove in each trench. A charge compensation plug of the first conductivity type substantially fills each groove.

42 Claims, 9 Drawing Sheets

HIGH-VOLTAGE SEMICONDUCTOR DEVICE AND METHOD OF FABRICATING THE SAME

CROSS-REFERENCES TO RELATED APPLICATIONS

This application claims priority to the Korean Patent Application No. 10-2006-0113032, filed on Nov. 15, 2006 in the Korean Intellectual Property Office, the disclosure of which is incorporated herein in its entirety by reference.

BACKGROUND OF THE INVENTION

The present invention relates to a high-voltage semiconductor device and a method of fabricating the same, and more particularly, to a high-voltage semiconductor device having a superjunction structure that is obtained by alternately forming impurity layers of different types of conductivity.

Conventionally, a high-voltage semiconductor device, such as a power metal oxide semiconductor field effect transistor (MOSFET) or an insulated gate bipolar transistor (IGBT), includes a source region and a drain region that are disposed on a top surface and a bottom surface, respectively, of a semiconductor body. Also, the high-voltage semiconductor device includes a gate insulating layer, which is disposed on the top surface of the semiconductor body adjacent to the source region, and a gate electrode, which is disposed on the gate insulating layer.

When the high-voltage semiconductor device is turned on, the semiconductor body provides a conductive path through which a drift current flows from the drain region to the source region. Also, when the high-voltage semiconductor device is turned off, the semiconductor body provides a depletion region that expands in a vertical direction due to an applied reverse bias voltage. The characteristics of the depletion region provided by the semiconductor body determine the breakdown voltage of the high-voltage semiconductor device.

In the above-described high-voltage semiconductor device, in order to minimize loss of conduction in a turn-on state and increase a switching rate, a vast amount of research has been conducted on reducing the turn-on resistance of the semiconductor body that provides the conductive path. Conventionally, one skilled in the art knows that the turn-on resistance of the semiconductor body may be reduced by increasing the concentration of impurities in the semiconductor body.

However, when the concentration of impurities in the semiconductor body is increased, space charges increase in the semiconductor body thus, lowering the breakdown voltage of the high-voltage semiconductor device. In order to overcome this drawback, various high-voltage semiconductor devices having a superjunction structure have been proposed. One known high-voltage semiconductor device with a superjunction structure is shown in FIG. 1.

Referring to FIG. 1, high-voltage semiconductor device 100 includes a superjunction that is obtained by alternately forming an N-type impurity region (referred to as an N-type pillar 21) and a P-type impurity region (referred to as a P-type pillar 22) in a horizontal direction. Each of the N-type pillars 21 and the P-type pillars 22 extend in a vertical direction in a semiconductor layer 60 disposed on a semiconductor substrate 10. A lightly doped P-type well region 30 is disposed in semiconductor layer 60, and a heavily doped N-type source region 40 is disposed in the lightly doped P-type well region 30 over the semiconductor layer 60. A source electrode S is electrically connected to the heavily doped N-type source region 40. Also, the high-voltage semiconductor device 100 includes a gate stack 50, which is disposed on the semiconductor layer 60 adjacent to the heavily doped N-type source region 40. The gate stack 50 includes a gate insulating layer 51 and a gate electrode 52. Also, the semiconductor substrate 10 that is connected to a bottom surface of the semiconductor layer 60 functions as a drain electrode D.

When the high-voltage semiconductor device 100 is turned on, the N-type pillars 21 provide a conductive path through which charges flow from the source electrode S through a channel disposed under the gate stack 50 to the drain electrode D. When the high-voltage semiconductor device 100 is turned off, the N-type pillar 21 and the P-type pillar 22 are depleted due to a reverse bias voltage, so that the high-voltage semiconductor device can have a sufficiently high breakdown voltage.

Particularly, when the amount of charge of the N-type pillar 21 is balanced with the amount of charge of the P-type pillar 22, the N- and P-type pillars 21 and 22 are completely depleted in a turn-off state of the high-voltage semiconductor device 100 so that the N- and P-type pillars 21 and 22 may function as an ideal insulator. By considering a unit superjunction U (designated by a dotted quadrangle) comprised of half of the N-type pillar 21 and half of the P-type pillar 22 that are disposed adjacent to each other, Equation 1 below should be satisfied in order to balance the amount of charge of the N-type pillar 21 with the amount of charge of the P-type pillar 22.

$$Nn \times \tfrac{1}{2} Wn = Np \times \tfrac{1}{2} Wp \tag{1}$$

wherein Nn denotes the dopant concentration of the N-type pillar 21, Np denotes the dopant concentration of the P-type pillar 22, Wn denotes the width of the N-type pillar 21, and Wp denotes the width of the P-type pillar 22.

As described above, when the amount of charge of the N-type pillar 21 is balanced with the amount of charge of the P-type pillar 22, a breakdown voltage may be determined by a product of the height H of the unit superjunction U and an electric field generated between the unit superjunctions U. As a result, even if the resistance of the high-voltage semiconductor device 100 is reduced by increasing the dopant concentration of the N-type pillar 21, since the resistivity of the N-type pillar 21 does not affect the breakdown voltage, a high breakdown voltage can be obtained.

In order to fabricate the high-voltage semiconductor device 100 having the conventional superjunction structure, for example, an N-type semiconductor layer 60 is formed using an epitaxial growth process on the semiconductor substrate 10, and the N-type semiconductor layer 60 is etched to form a trench in a region where the P-type pillar 22 will be formed. Thereafter, a P-type epitaxial layer is formed using, for example, a chemical vapor deposition (CVD) process, to fill the trench. In this process, a superjunction structure in which the N-type pillar 21 and the P-type pillar 22 are alternately formed may be fabricated.

However, because the superjunction structure has a height of several tens of μm to hundreds of μm and a width of several μm, it is difficult to form the trench having a precisely vertical sidewall in the semiconductor layer 60 using an etching process. Even if the trench having the vertical sidewall in the semiconductor layer 60 is formed, it is difficult to fill the trench with an epitaxial layer given the high aspect ratio of the trench.

When the sidewall of the trench formed using an anisotropic etching process forms an angle δ less than 90°, the P-type pillar 22 tapers in a depthwise direction of the semiconductor layer 60. As a result, the amount of charge of the P-type pillar 22 gradually decreases in the depthwise direction thereof, and the amount of charge of the N-type pillar 21 relatively increases in the depthwise direction thereof and thus, the charge balance cannot be maintained in the unit superjunction U. The charge imbalance in the unit superjunction U worsens as the angle δ formed by the sidewall of the trench decreases and thus, a breakdown voltage decreases.

BRIEF SUMMARY OF THE INVENTION

In accordance with the present invention, a superjunction technique for high-voltage semiconductor devices is disclosed where charge balance may always be maintained in a depthwise direction of a unit superjunction irrespective of an angle formed between a sidewall of a trench and a horizontal direction of a semiconductor layer so that the high-voltage semiconductor device can maintain a high breakdown voltage regardless of the angle of the trench sidewalls. Methods of fabricating such superjunction high-voltage devices are also disclosed.

According to an aspect of the present invention, a high-voltage semiconductor device is provided which includes a semiconductor layer having a top surface, a bottom surface, and a plurality of pillars of a first conductivity type defined by a plurality of trenches. The trenches extend from the top surface of the semiconductor layer toward the bottom surface thereof. A charge compensation layer of a second conductivity type is disposed over at least sidewalls of each trench to a predetermined thickness to form a groove in each trench. A charge compensation plug of the first conductivity type substantially fills each groove.

In some embodiments of the present invention, the first conductivity type may be N type, and the second conductivity type may be P type.

In some embodiments of the present invention, the sum of the amount of charges in the pillars and in the charge compensation plugs may be substantially equal to the amount of charges in the charge compensation layer in a depthwise direction of the grooves, so that charge balance can be maintained in a unit superjunction. The pillars and the charge compensation plugs may substantially have the same first dopant concentration, and the charge compensation layer may have a second dopant concentration greater than the first dopant concentration.

In some embodiments of the present invention, the high-voltage semiconductor device may further include a plurality of wells of a second conductivity type disposed adjacent to the top surface of the semiconductor layer, wherein the wells form PN junctions with the charge compensation plugs and the pillars. Also, the high-voltage semiconductor device may further include a plurality of source regions of a first conductivity type disposed in the well regions adjacent to the top surface of the semiconductor layer, and a plurality of gate stacks each laterally extending over a top surface of a corresponding well and a top surface of a corresponding pillar such that an underlying region of the corresponding well forms a channel between a source region and the corresponding pillar. As a result, the high-voltage semiconductor device may maintain a high breakdown voltage.

According to another aspect of the present invention there is provided a method of fabricating a high-voltage semiconductor device. The method may include the following steps. A semiconductor layer is provided. A plurality of trenches are formed in the semiconductor layer to define a plurality of pillars of a first conductivity type in the semiconductor layer between adjacent trenches, wherein the trenches extend from a top surface of the semiconductor layer toward a bottom surface of the semiconductor layer. A charge compensation layer of a second conductivity type is formed over at least sidewalls of each trench to a predetermined thickness thereby forming a groove in each trenches. Each groove is substantially filled with a charge compensation plug of the first conductivity type. Thus, a unit superjunction of the high-voltage semiconductor device is formed.

In some embodiments of the present invention, the method further includes the step of forming a first epitaxial layer on a semiconductor substrate, wherein the trenches may be formed in the first epitaxial layer. In some embodiments, the step of forming a charge compensation layer includes forming a second epitaxial layer by performing a CVD process and doping in-situ using a layer-forming gas containing the impurity ions. In yet other embodiments, the step of filling each groove with a charge compensation plug includes forming a third epitaxial layer by performing a CVD process and doping in-situ using a layer-forming gas containing the impurity ions.

In yet some other embodiments, after forming the third epitaxial layer, the resultant structure may be planarized using a chemical mechanical polishing (CMP) process or an etchback process until the top surface of the semiconductor layer is exposed. Also, the method may further include performing a thermal diffusion process of impurities in the charge compensation layer and the charge compensation plugs.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
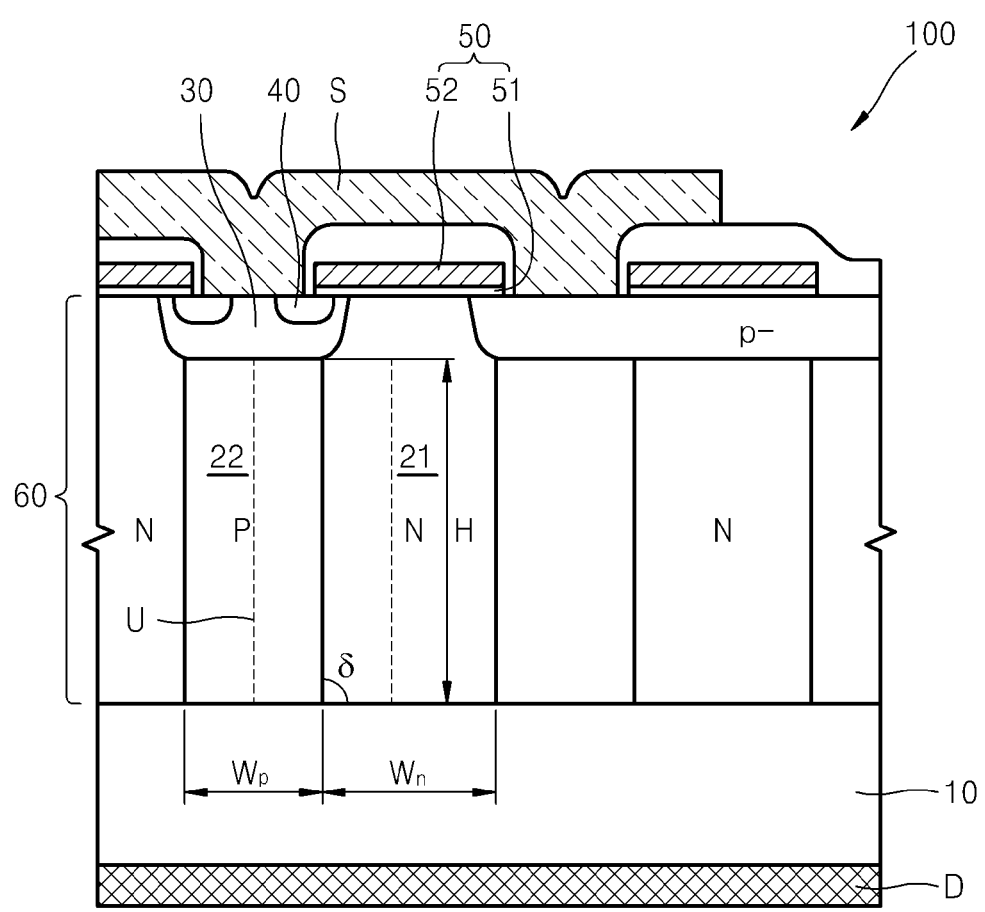
FIG. 1 is a cross sectional view of a conventional high-voltage semiconductor device having a superjunction structure.

The present invention will now be described more fully hereinafter with reference to the accompanying drawings, in which exemplary embodiments of the invention are shown. The present invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions are exaggerated for clarity. It will also be understood that when a layer is referred to as being "on" another layer or substrate, it can be directly on the other layer or substrate or intervening layers may also be present. The same reference numerals are used to denote the same elements throughout the specification.

Figure 2A:
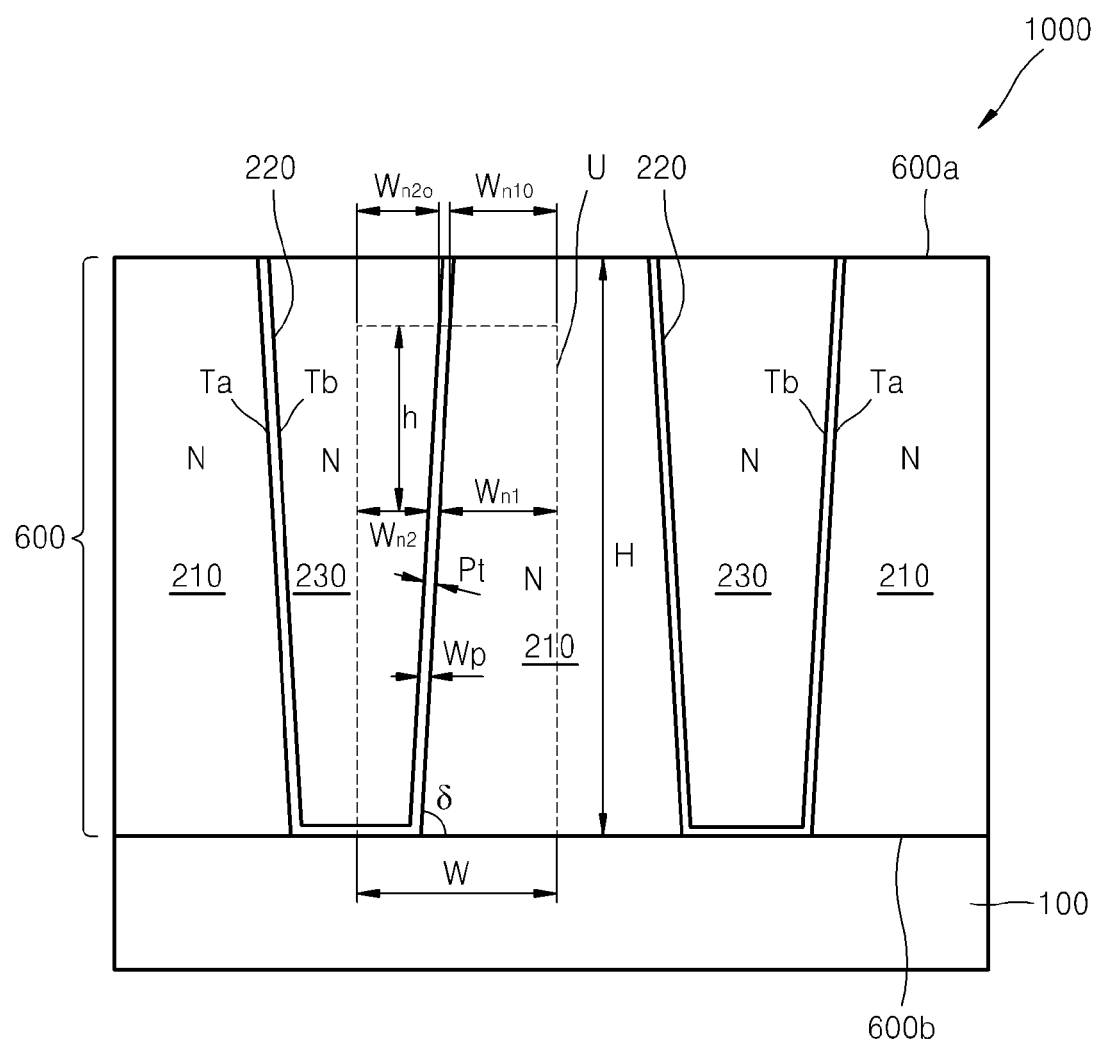
FIG. 2A is a cross sectional view of a unit superjunction of a high-voltage semiconductor device according to an embodiment of the present invention.
Figure 2B:
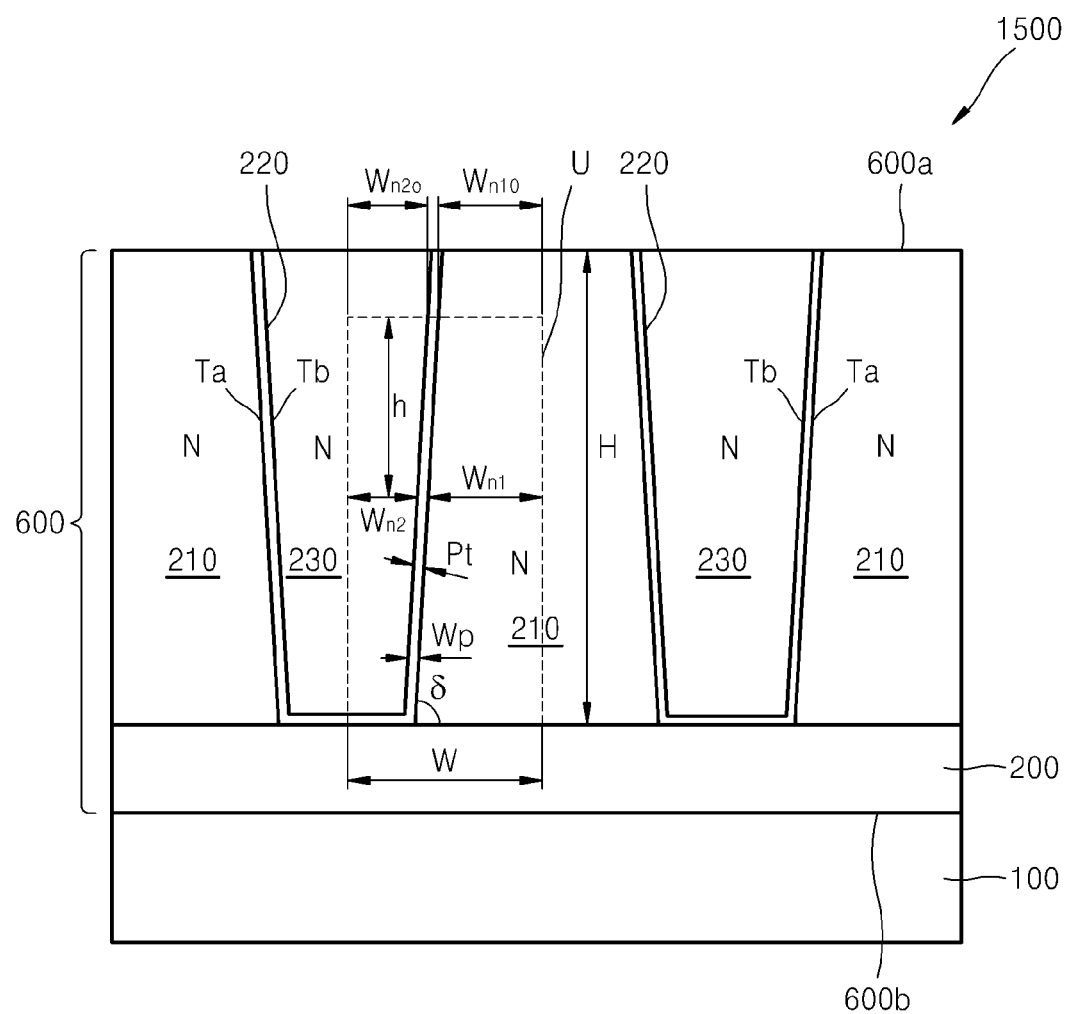
FIG. 2B is a cross sectional view of a unit superjunction of a high-voltage semiconductor device according to another embodiment of the present invention.

FIG. 2A is a cross sectional view of a unit superjunction U of a high-voltage semiconductor device 1000 according to an embodiment of the present invention, and FIG. 2B is a cross sectional view of a unit superjunction U of a high-voltage semiconductor device 1500 according to another embodiment of the present invention. In FIGS. 2A and 2B, a dotted quadrangle refers to the unit superjunction U, and a width W of the dotted quadrangle corresponds to a cell pitch of the unit superjunction U. Also, a height H of the dotted quadrangle corresponds to the depth of a trench $T_a$ as described later.

Referring to FIGS. 2A and 2B, the unit superjunction U, which is disposed in a semiconductor layer 600, may include a pillar 210, a charge compensation layer 220, and a charge compensation plug 230. The semiconductor layer 600 may be formed on a semiconductor substrate 100, such as a silicon substrate, using a chemical vapor deposition (CVD) process. The formation of the semiconductor layer 600 may be performed using a layer forming gas containing silicon atoms, for example, $SiH_4$, $Si_2H_4$, $Si_2H_6$, or $SiH_2Cl_2$, at a temperature of about 800 to 1200° C. In this case, an impurity gas containing a Group V impurity element (or a donor), such as $PH_3$ or $AsH_3$, may be supplied along with the layer forming gas, so that N-type impurities can be doped into the semiconductor layer 600 in-situ during the growth of the semiconductor layer 600.

The pillar 210 of the semiconductor layer 600 is provided by a mesa that is defined by trenches $T_a$ that extends from a top surface 600a of the semiconductor layer 600 toward a bottom surface 600b thereof. For example, the pillar 210 of the semiconductor layer 600 may be of a N-type conductivity and have a predetermined dopant concentration $N_{a1}$.

The trenches $T_a$ may be formed in semiconductor layer 600 using a plasma dry etching process. In some examples of the present invention, the trenches $T_a$ may extend from the top surface 600a of the semiconductor layer 600 to the bottom surface 600b thereof as illustrated in FIG. 2A. In other examples of the present invention, as illustrated in FIG. 2B, the trenches $T_a$ may be formed to a depth within the top and bottom surfaces 600a and 600b of the semiconductor layer 600. In the case as illustrated in FIG. 2B, an impurity layer 200, which may have the same dopant concentration or a lower dopant concentration than the pillar 210, may be formed under the trench $T_a$ and/or the pillar 210. The impurity layer 200 functions as a buffer layer or a field stop layer.

The trenches $T_a$ may have a stripe shape or a thread shape. Considering that the semiconductor layer 600 has a thickness of several tens to several hundreds of μm, a sidewall of the first trench $T_a$ formed using a plasma dry etching process may make an angle δ equal to or less than 90° with a horizontal direction of the semiconductor layer 600. As illustrated in FIGS. 2A and 2B, the pillar 210 defined by the trenches $T_a$ has a linear sectional shape having an angle δ. However, the sectional shape of the pillar 210 is not limited to the linear sectional shape, and the pillar 210 may have a parabolic sectional shape or a sectional shape including lines with different inclinations.

In the unit superjunction U, when the sidewall of the trench $T_a$ has a linear sectional shape having an angle δ less than 90° with the horizontal direction of the semiconductor layer 600, a unit width $W_{n1}$ of the pillar 210 linearly increases from the critical width $W_{n1o}$ of the pillar 210, which corresponds to ½ an upper width of the pillar 210, as the depth of the pillar 210 increases, as expressed by Equation 2 below. Thus, an amount of charge $Q_{n1}$ of the pillar 210 with respect to a depth "h" measured from the top surface 600a of the semiconductor layer 600 increases as expressed by Equation 3.

$$W_{n1}=W_{n1o}+h/\tan(\delta) \quad (2)$$

$$Q_{n1}=N_{n1}\times W_{n1}=N_{n1}\times(W_{n1o}+h/\tan(\delta)) \quad (3)$$

In the embodiments of the present invention, a charge compensation layer 220 having a predetermined thickness is provided on an inner wall of the trench $T_a$. In some embodiments of the present invention, the charge compensation layer 220 may coat a side wall of the inner wall of the trench $T_a$. In other embodiments of the present invention, the charge compensation layer 220 may coat both of the side wall and the bottom surface of the inner wall of the trench $T_a$, as illustrated in FIG. 2a. The charge compensation layer 220 is a semiconductor layer of a type of conductivity opposite to the type of conductivity of the pillar 210. For example, the charge compensation layer 220 may be a P-type semiconductor layer and form a PN junction with an adjacent pillar 210.

The charge compensation layer 220 may be formed using a CVD process. The formation of the charge compensation layer 220 may be performed using a layer forming gas containing silicon atoms, for example, $SiH_4$, $Si_2H_4$, $Si_2H_6$, or $SiH_2Cl_2$, at a temperature of about 700 to 1100° C. Then, the charge compensation layer 220 may be doped with impurity ions using an ion implantation process or an annealing process using a gas containing a Group III element (or an acceptor), such as $B_2H_5$. Alternatively, the charge compensation layer 220 may be formed by supplying a gas containing a Group III element along with the layer forming gas so that an in-situ doping process can be performed on the charge compensation layer 220.

The dopant concentration $N_p$ of the charge compensation layer 220 may be higher than the dopant concentration $N_{n1}$ of the pillar 210 such that a thickness $P_t$ of the charge compensation layer 220 can be less than the critical width $W_{n1o}$. In the unit superjunction U, the width $W_p$ of the charge compensation layer 220 is expressed by Equation 4 below. Since the angle δ of the inner wall of the trench $T_a$ is close to 90°, the width $W_p$ of the charge compensation layer 220 is almost equal to the thickness $P_t$ of the charge compensation layer 220. The amount of charge $Q_p$ of the charge compensation layer 220 may be determined only by the dopant concentration $N_p$ and thickness $P_t$ thereof as expressed by Equation 5 below. Therefore, the amount of charge $Q_p$ of the charge compensation layer 220 can be constant irrespective of the depth of the charge compensation layer 220.

In the embodiment where only sidewalls of the trench $T_a$ are coated with the charge compensation layer 220, after the charge compensation layer 220 is formed, the charge compensation layer 220 may be removed from the bottom surface of the trench $T_a$ using an etching process in order to expose the bottom surface of first trench $T_a$.

In another embodiment of the present invention, an impurity diffusion process may be performed using a gas containing an impurity element, for example, a Group III element. Thus, an impurity layer (not illustrated) having the dopant concentration $N_p$ (hereinafter referred to as a charge compensation impurity layer) may be formed by diffusion along the inner wall of the trench $T_a$ to a depth corresponding to the thickness $P_t$ of the charge compensation layer 220. In this case, a process of forming the charge compensation layer 220 may be omitted so that the thermal budget of an epitaxial growth process can be relieved.

$$W_p=P_t/\sin(\delta)\approx P_t \quad (4)$$

$$Q_p=N_p\times P_t \quad (5)$$

In some embodiments of the present invention, a groove $T_b$ may be formed by the charge compensation layer 220 in the trench $T_a$ and filled with the charge compensation plug 230. In the above-described embodiment where the charge compensation impurity layer is formed using an impurity diffusion process, the charge compensation plug 230 may be formed on the trench $T_a$.

The charge compensation plug 230 may be of the same type of conductivity as that of the pillar 210 and of an opposite type of conductivity as that of the charge compensation layer 220. For example, where pillar 210 is of N-type conductivity and charge compensation layer 220 is of P-type conductivity, the charge compensation plug 230 may be of N-type conductivity. The charge compensation plug 230 may be, for example, an epitaxially grown semiconductor layer containing a Group V element, which may be formed by doping impurities in situ using a gas containing the impurities during the epitaxial growth of the semiconductor layer. After the charge compensation plug 230 is deposited using a CVD process, a chemical mechanical polishing (CMP) process or an etch-back process may be further performed until a top surface of the semiconductor layer 600 is exposed.

In some embodiments of the present invention, a second epitaxial layer, which will be the charge compensation layer 220, may be formed on all exposed surfaces of the semiconductor layer 600 including the entire surface of the inner walls of the first trench $T_a$ while impurities may be doped into the second epitaxial layer in-situ through a CVD process using a layer forming gas containing the impurities. Subsequently, a third epitaxial layer, which will be the charge compensation plug 230, may be formed on the second epitaxial layer to fill the groove $T_b$ while impurities may be doped into the third epitaxial layer in-situ through a CVD process using a layer forming gas containing the impurities. After the second and third epitaxial layers are sequentially formed, a CMP process or an etch-back process may be performed until the top surface of the semiconductor layer 600 may be exposed. This process results in formation of the charge compensation layer 220 and the charge compensation plug 230.

A unit width $W_{n2}$ of the charge compensation plug 230 gradually decreases from the critical width $W_{n2o}$ of a top surface of the charge compensation plug 230, which corresponds to ½ an upper width of the charge compensation plug 230, as the depth of the charge compensation plug 230 increases as expressed by Equation 6 below. Thus, an amount of charge $Q_{n2}$ of the charge compensation plug 230 with respect to a depth "h" of the charge compensation plug 230 decreases as expressed by Equation 7.

$$W_{n2}=W_{n2o}-h/\tan(\delta) \quad (6)$$

$$Q_{n2}=N_{n2}\times W_{n2}=N_{n2}\times(W_{n2o}-h/\tan(\delta)) \quad (7)$$

The sum $Q_n$ of the amounts of charges of the pillar 210 and the charge compensation plug 230 may be obtained by Equation 8 derived from Equations 3 and 7.

$$Q_n=Q_{n1}+Q_{n2}=N_{n1}\times(W_{n1o}+h/\tan(\delta))+N_{n2}\times(W_{n2o}-h/\tan(\delta)) \quad (8)$$

In the unit superjunction U according to the embodiments of the present invention, when the inner wall of the trench $T_a$ makes an angle δ less than 90° with a horizontal direction of the semiconductor layer 600, the amount of charge $Q_{n1}$ of the pillar 210 gradually increases as the depth "h" of the pillar 210 increases. However, since the amount of charge $Q_p$ of the charge compensation layer 220 is constant, the balance of charges as expressed by Equation 1 cannot be maintained. However, when the charge compensation plug 230 and the pillar 210 are of the same N-type of conductivity, the sum $Q_n$ of the amount of charge $Q_{n1}$ of the pillar 210 and the amount of charge $Q_{n2}$ of the charge compensation plug 230 may be controlled to be constant irrespective of an arbitrary depth "h" of the unit superjunction U.

For instance, in Equation 8, assuming that the dopant concentration $N_{n1}$ of the pillar 210 and the dopant concentration $N_{n2}$ of the charge compensation plug 230 are each equal to $N_n$, the sum $Q_n$ of the amount of charge $Q_{n1}$ of the pillar 210 and the amount of charge $Q_{n2}$ of the charge compensation plug 230 may be constant irrespective of the depth "h" as expressed by Equation 9. In other words, the sum $Q_n$ of the amount of charge $Q_{n1}$ of the pillar 210 and the amount of charge $Q_{n2}$ of the charge compensation plug 230 may be determined by the dopant concentration $N_n$ of the pillar 210 and the charge compensation plug 230, the critical width $W_{n1o}$ of the pillar 210, and the critical width $W_{n2o}$ of the charge compensation plug 230 in the unit superjunction U, while the sum $Q_n$ of the amount of charge $Q_{n1}$ of the pillar 210 and the amount of charge $Q_{n2}$ of the charge compensation plug 230 may be independent of the angle δ of the inner wall of the trench $T_a$.

Finally, a charge balance equation as expressed by Equation 10 can be derived from the results of Equations 5 and 9. Equation 10 expresses a condition under which the amount of charge $Q_n$ of the pillar 210 and the charge compensation plug 230 may be balanced with the amount of charge $Q_p$ of the charge compensation layer 220 in the unit superjunction U.

$$Q_n=N_n\times(W_{n1o}+W_{n2o}) \quad (9)$$

$$Q_n=Q_p=N_n\times(W_{n1o}+W_{n2o})=N_p\times P_t \quad (10)$$

From Equation 10, it can be seen that the imbalance of charges between the pillar 210 and the charge compensation layer 220 in a depthwise direction may be resolved by the charge compensation plug 220 having the same conductivity and dopant concentration as that of the pillar 210. By increasing the concentration $N_p$ of the charge compensation layer 220 to be higher than the concentration $N_n$ of the pillar 210 or the charge compensation plug 230, the thickness $P_t$ of the charge compensation layer 220 may be reduced. As the thickness $P_t$ of the charge compensation layer 220 decreases, the balance of charges may be controlled more precisely.

According to some embodiments of the present invention, when the P-type charge compensation layer 220 may be formed to a uniform thickness $P_t$, the amount of charge $Q_p$ of the charge compensation layer 220 with respect to the depth thereof in the unit superjunction U is substantially constant. Also, the sum $Q_n$ of the amount of charge $Q_{n1}$ of the pillar 210 and the amount of charge $Q_{n2}$ of the charge compensation plug 230 may be maintained constant over the entire depth H of the unit superjunction U.

As a result, only by determining the dopant concentrations such that the amount of charge $Q_n$ of the pillar 210 and the charge compensation plug 230 is equal to the amount of charge $Q_p$ of the charge compensation layer 220, a high-voltage semiconductor device including a superjunction that maintains the balance of charges irrespective of the angle δ of the inner wall of the trench $T_a$ can be provided. Furthermore, according to some embodiments of the present invention, the angle δ of the inner wall of the trench $T_a$ may be maintained to be less than 90°, so that the charge compensation layer 220 and the charge compensation plug 230 may be reliably formed due to a more relaxed aspect ratio of the trench $T_a$.

Figure 3:
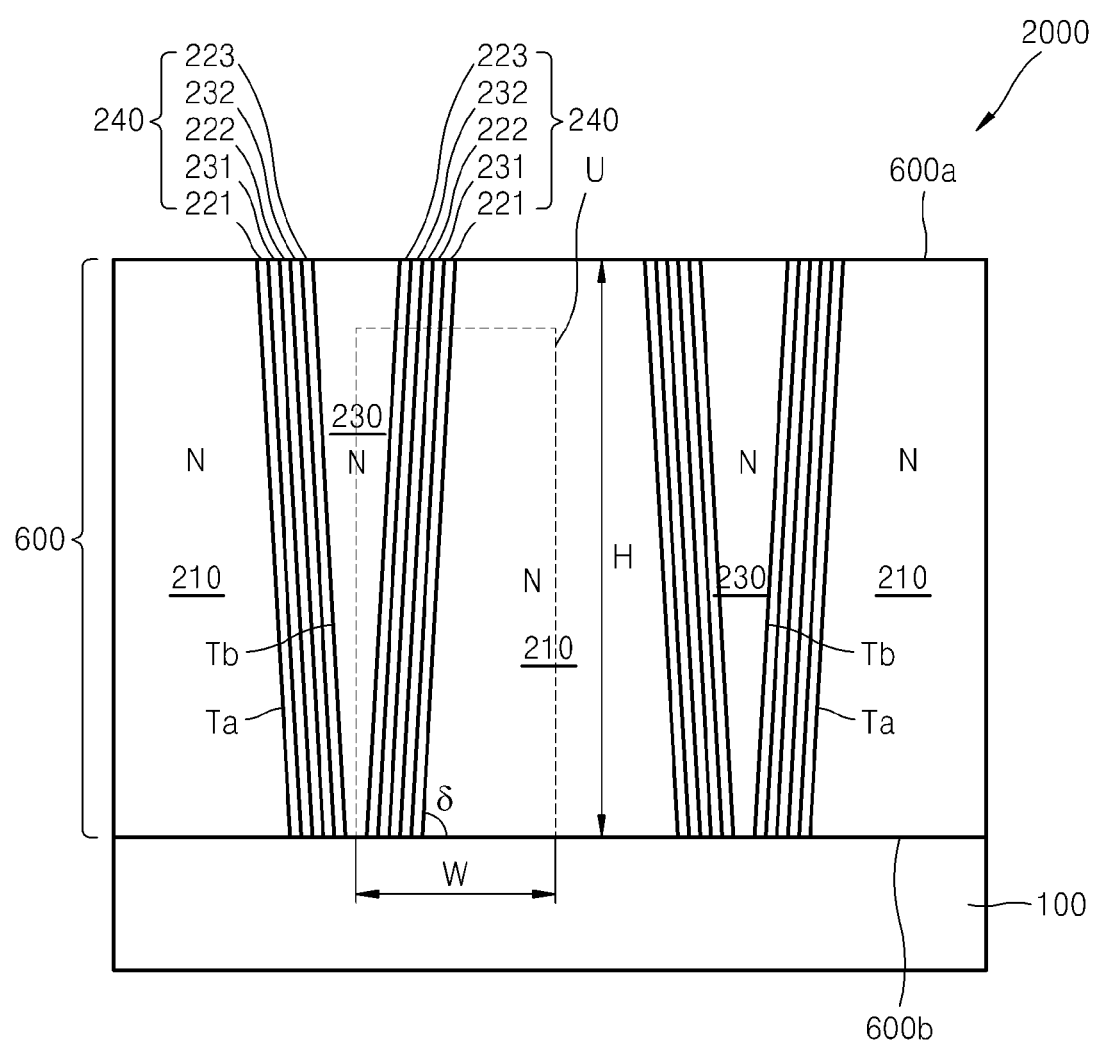
FIG. 3 is a cross sectional view of a unit superjunction of a high-voltage semiconductor device according to yet another embodiment of the present invention.

FIG. 3 is a cross sectional view of a unit superjunction U of a high-voltage semiconductor device 2000 according to another embodiment of the present invention. In FIG. 3, a dotted quadrangle refers to the unit superjunction U, and a width W of the dotted quadrangle corresponds to a cell pitch of the unit superjunction U. Also, a height H of the dotted quadrangle corresponds to the depth of a trench $T_a$.

Referring to FIG. 3, the unit superjunction U formed in the semiconductor layer 600 includes a pillar 210, a multi-layered charge compensation layer stack 240, and an N-type charge compensation plug 230. Unlike the unit superjunction U shown in FIGS. 2A and 2B, the multi-layered charge compensation layer stack 240 may include, for example, one or more P-type first charge compensation layers 221, 222, and 223 and one or more N-type second charge compensation layers 231 and 232, each having a predetermined thickness, which may be alternately stacked on the trench $T_a$. As described above, the multi-layered charge compensation layer stack 240 may be formed, for example, by repeating an epitaxial growth process and an impurity doping process or by performing an in-situ doping process. In some embodiments of the present embodiment, a bottom surface of the first trench $T_a$ may not be coated with the first and second compensation layers 221, 231, 222, 232, and 223 unlike the bottom surface of the trench $T_a$ shown in FIGS. 2A and 2B.

A groove $T_b$ may be formed in the trench $T_a$ by the uppermost charge compensation layer 223 of the multi-layered charge compensation layer stack 240. An epitaxial layer containing, for example, a Group V element, may be deposited on the groove $T_b$ so that the N-type charge compensation plug 230 may be filled in the groove $T_b$. Due to the N-type charge compensation plug 230, a superjunction structure that satisfies a charge balance equation over the entire depth H of the unit superjunction U can be obtained.

For instance, assuming that the dopant concentration of the N-type pillar 210 is equal to the dopant concentration of the N-type charge compensation plug 230, the sum of the amounts of charges of the pillar 210 and the charge compensation plug 230 may be constant in the entire depthwise direction of the unit superjunction U. Also, the net charge of each of the P-type first charge compensation layers 221, 222, and 223 and the N-type second charge compensation layers 231 and 232 may be constant in the entire depthwise direction of the unit superjunction U. As a result, by appropriately selecting the dopant concentrations of the pillar 210, the charge compensation plug 230, the P-type first charge compensation layers 221, 222, and 223 and the N-type second charge compensation layers 231 and 232, a superjunction structure that satisfies a charge balance equation over the entire depth H of the unit superjunction U can be obtained. As stated above, in the high-voltage semiconductor device 2000 of the current embodiment of the present invention, since the internal volume of the groove $T_b$ of the unit superjunction U can be reduced using the multi-layered charge compensation layer stack 240, the thermal budget of the process for filling the groove $T_b$ with the N-type charge compensation plug 230 can be reduced.

Figure 4A:
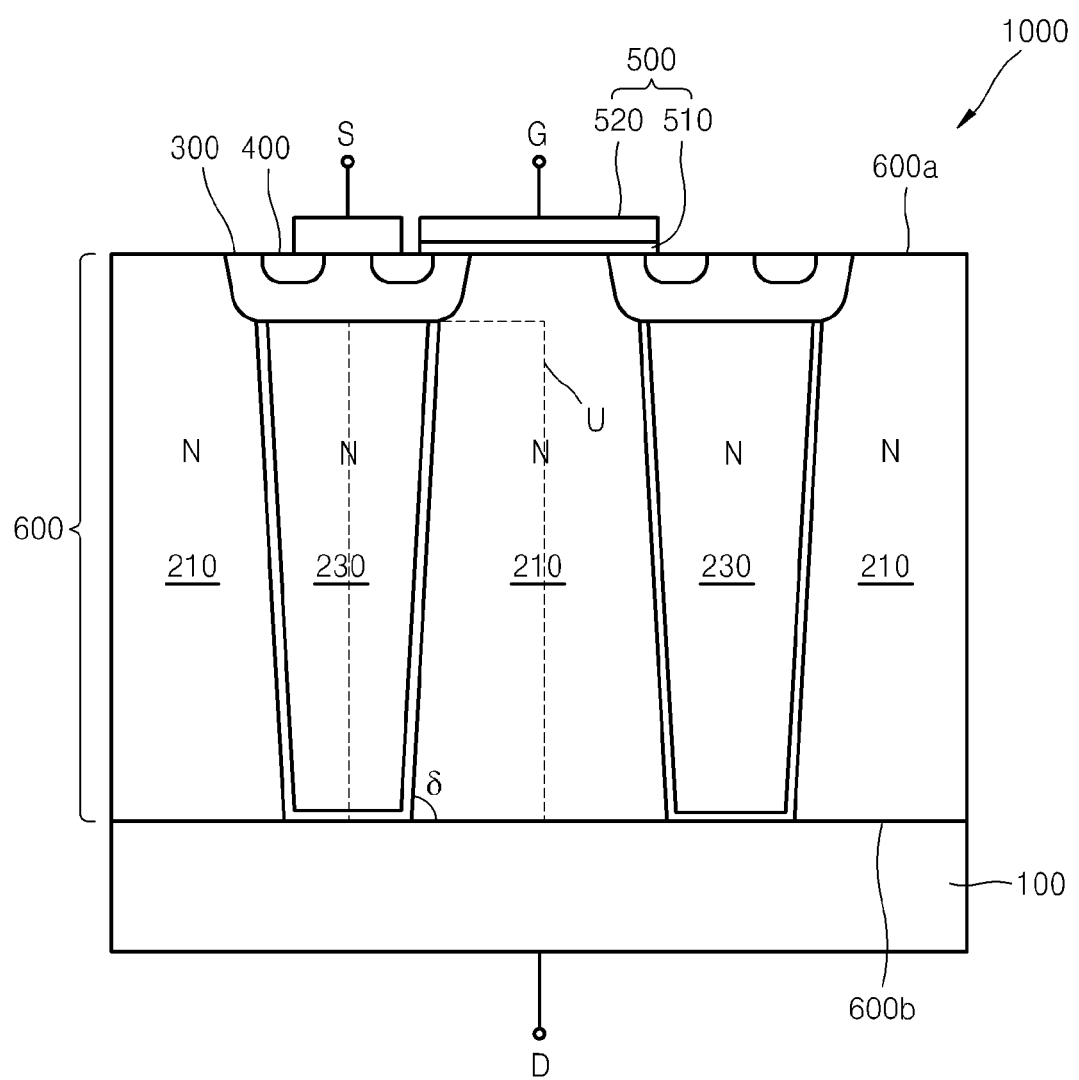
FIG. 4A is a cross sectional view of a high-voltage field effect transistor having the unit superjunction shown in FIG. 2A, according to an embodiment of the present invention.
Figure 4B:
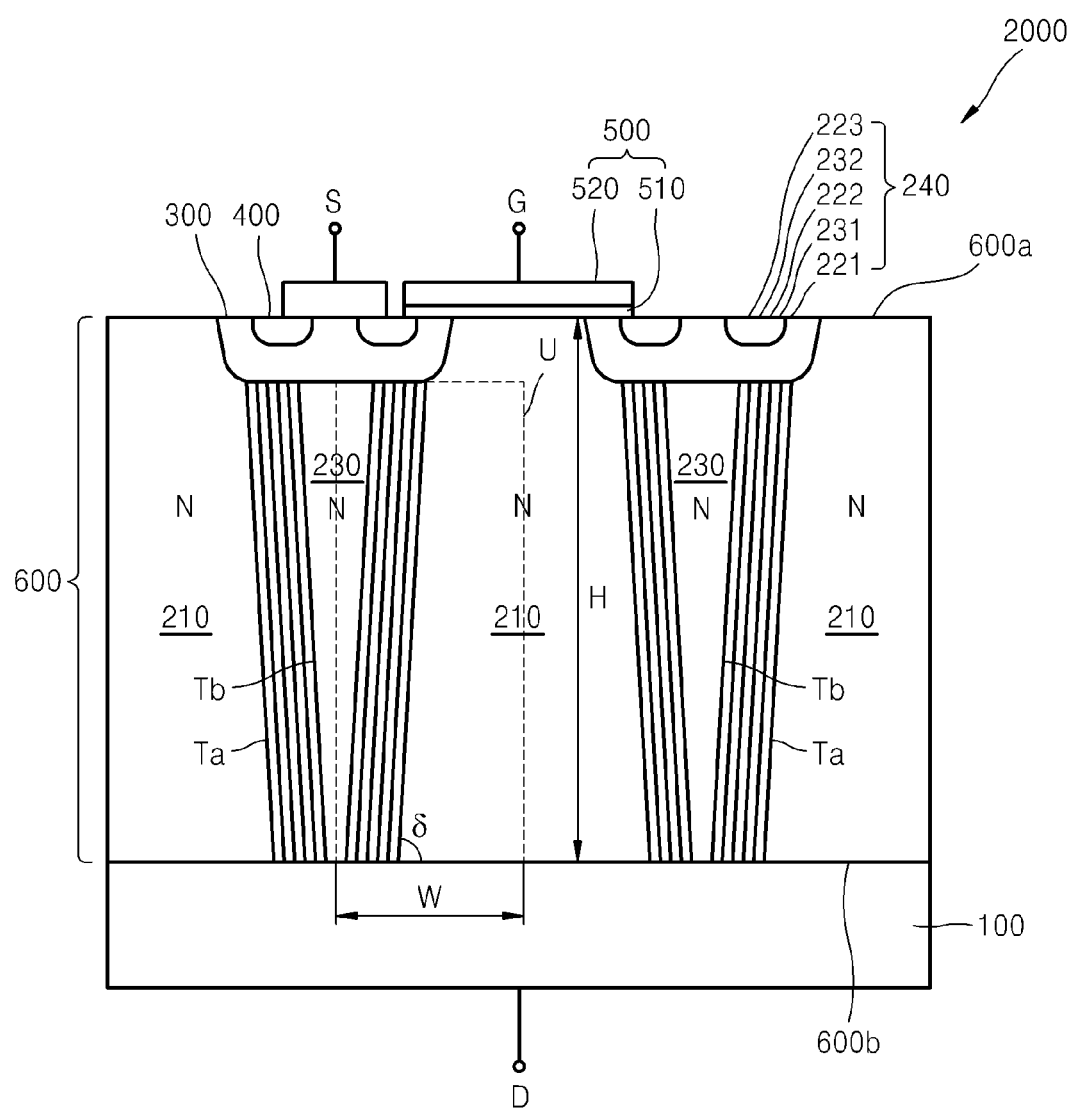
FIG. 4B is a cross sectional view of another high-voltage field effect transistor having the unit superjunction shown in FIG. 3, according to an embodiment of the present invention.
Figure 5A:
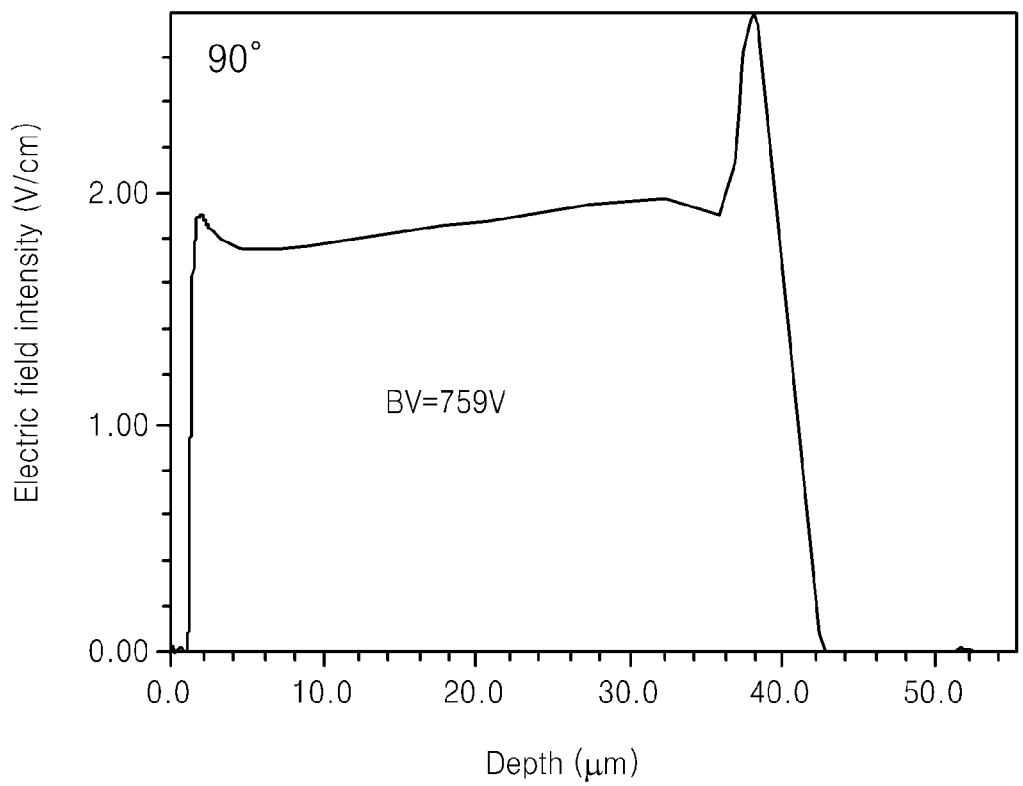
FIGS. 5A through 5D are graphs illustrating electric field intensity with respect to the depth of a high-voltage semiconductor device according to embodiments of the present invention.
Figure 5B:
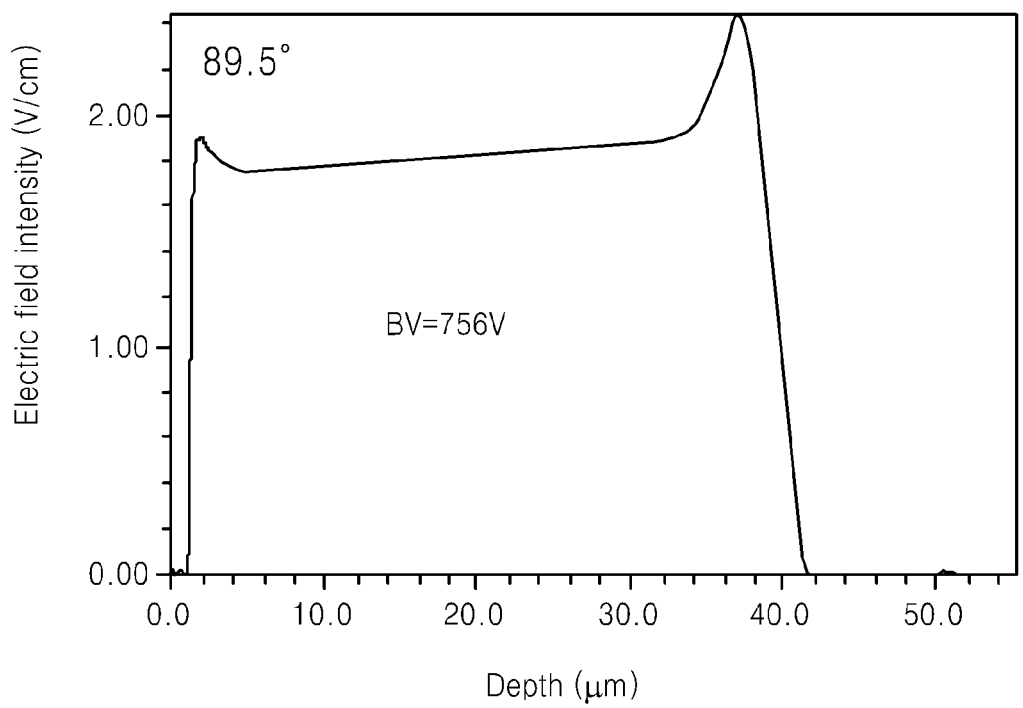
Figure 5C:
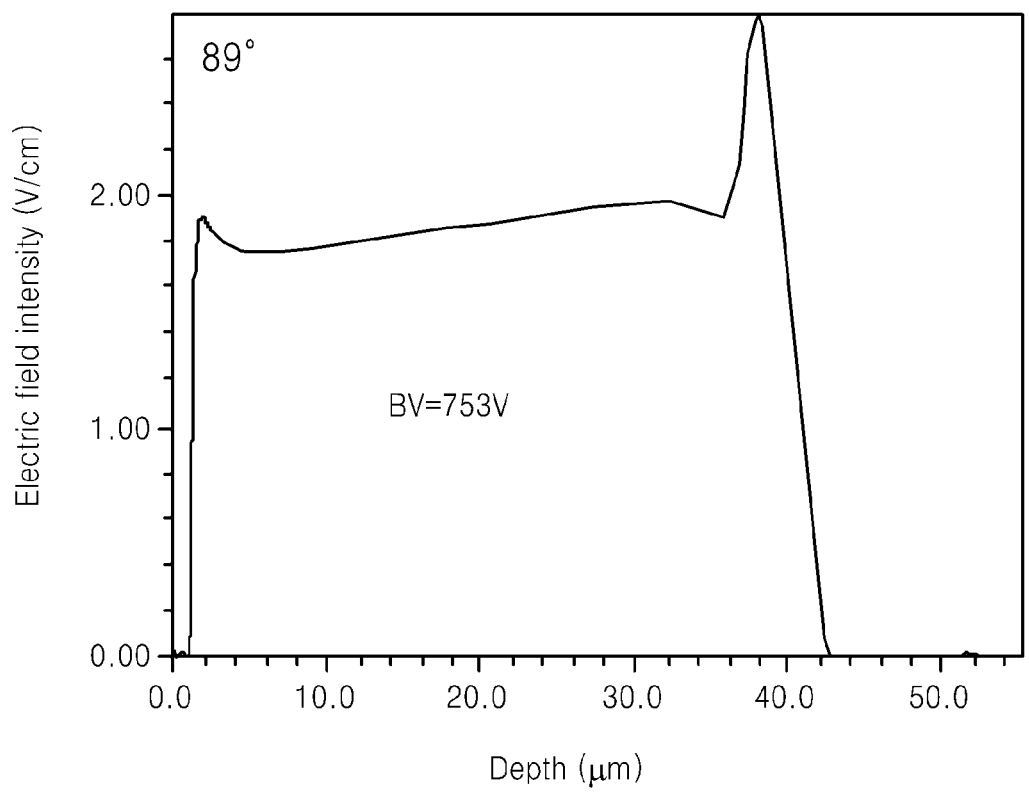
Figure 5D:
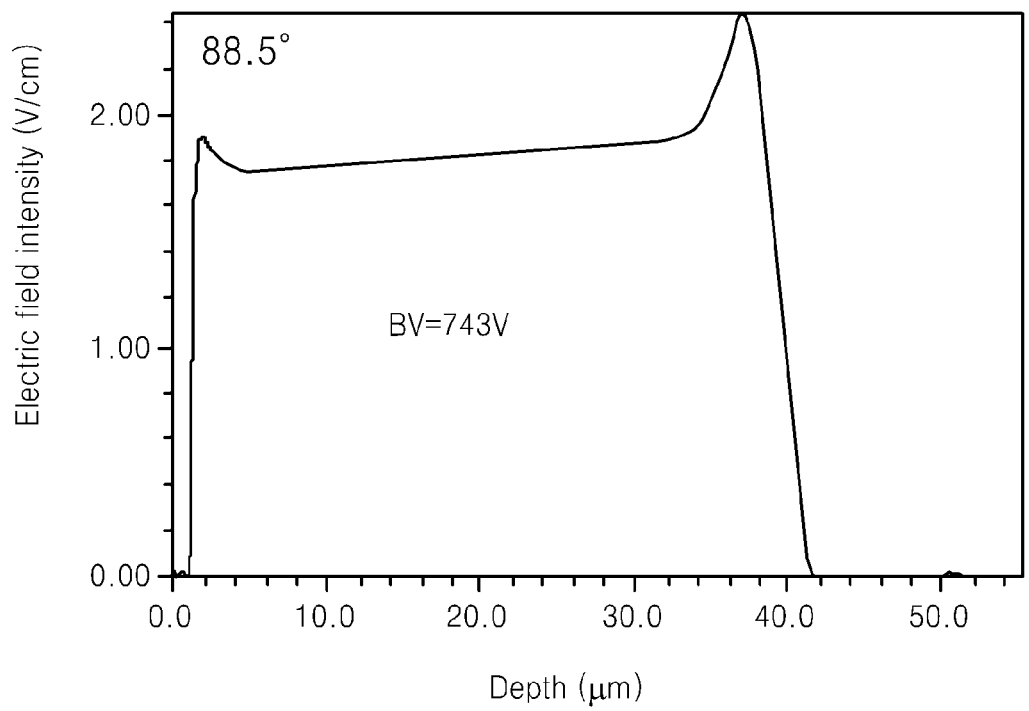

FIG. 4A is a cross sectional view of the high-voltage semiconductor device 1000 having the unit superjunction U shown in FIG. 2A, and FIG. 4B is a cross sectional view of the high-voltage semiconductor device 2000 having the unit superjunction U shown in FIG. 3, according to embodiments of the present invention.

Referring to FIG. 4A, P-type wells 300 are formed adjacent to the top surface 600a of the semiconductor layer 600 using an ion implantation process. For example, each of the P-type wells 300 may form a PN junction with each of the N-type charge compensation plugs 230 and the N-type pillars 210 adjacent to the charge compensation plugs 230.

Referring to FIG. 4B, P-type wells 300 are formed adjacent to the top surface 600a of the semiconductor layer 600 using an ion implantation process like in FIG. 4A. In this case, each of the P-type wells 300 may form a PN junction with each of the N-type charge compensation plugs 230, the N-type charge compensation layers 231 and 232 of the multi-layered charge compensation layer stack 240, and N-type pillars 210.

Then, using conventional techniques, a gate stack 500 including a gate insulating layer 510 and a gate electrode layer 520 may be formed over the mesa regions. The gate stack 500 may laterally extend over a top surface of the P-type well 300 and a top surface of the pillar 210. Subsequently, N-type source regions 400 may be formed adjacent to the top surface 600a of the semiconductor layer 600 in each of the P-type wells 300 adjacent to the gate stack 500. A highly doped P-type heavy body region (not shown) may be formed in well region 300. A source electrode S may be formed on the source region 400 and well region 300.

In the high-voltage semiconductor devices 1000, 1500 and 2000 according to the embodiments of the present invention, a semiconductor substrate 100 may be used as a drain electrode D. Each of the high-voltage semiconductor devices 1000, 1500 and 2000 may be operated as a power MOSFET or an IGBT depending on whether the semiconductor substrate 100 is of an N type or a P type. In the IGBT embodiment, the high-voltage semiconductor devices 1000 and 2000 might further include an impurity layer similar to impurity layer 200 described in FIG. 2B to prevent a punch through between an emitter and the drain.

Figure 6A:
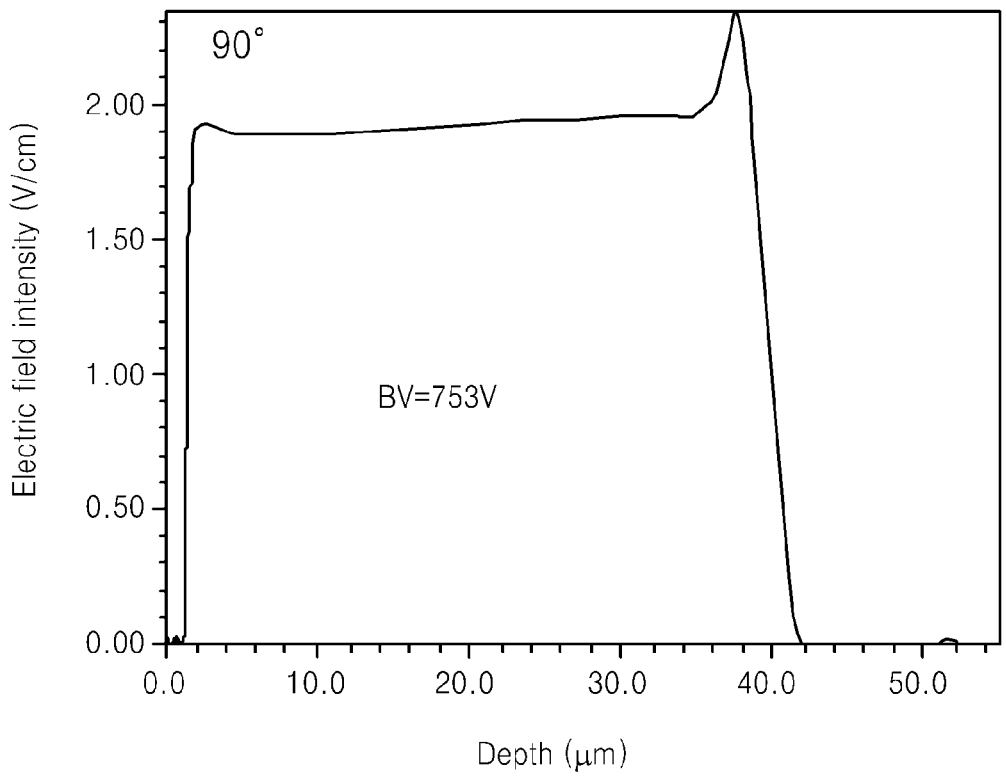
FIGS. 6A and 6B are graphs illustrating electric field intensity with respect to the depth of a high-voltage semiconductor device in which an intrinsic semiconductor layer is buried instead of a charge compensation plug.
Figure 6B:
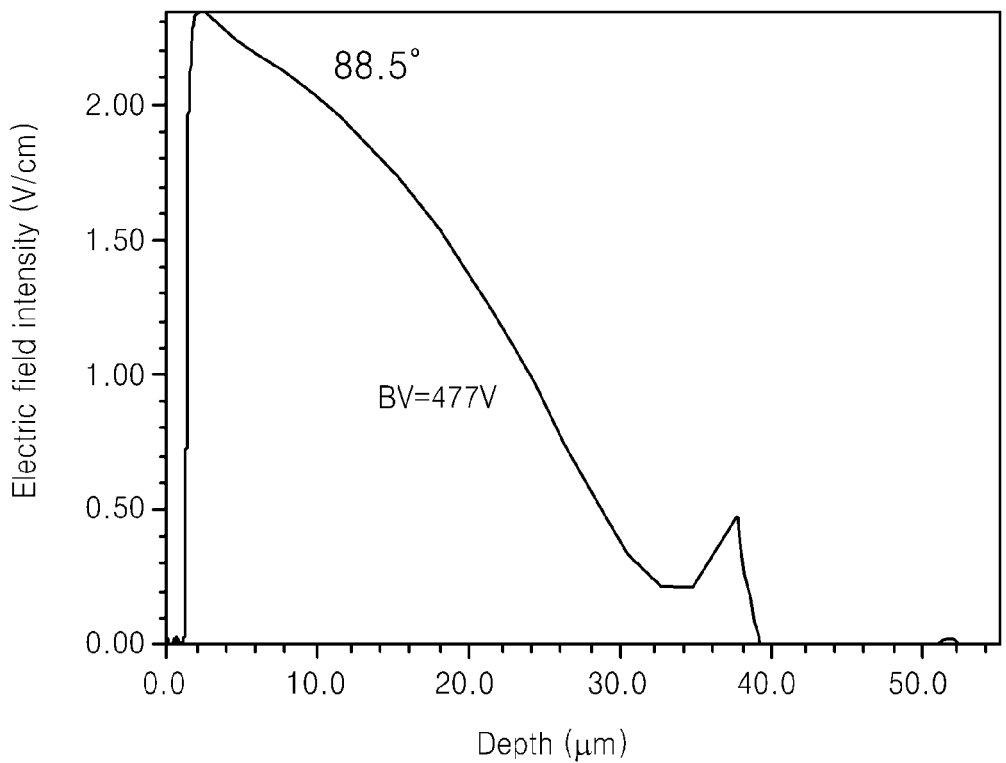

FIGS. 5A through 5D are graphs illustrating electric field intensity with respect to the depth of a high-voltage semiconductor device according to embodiments of the present invention, and FIGS. 6A and 6B are graphs illustrating electric field intensity with respect to the depth of a high-voltage semiconductor device in which an intrinsic semiconductor layer is buried instead of a charge compensation plug. The graphs in FIGS. 5A through 5D and 6A and 6B are graphs of simulation results with respect to the angle δ of the trench $T_a$. In FIGS. 5A through 5D and 6A and 6B, the horizontal axis denotes the depth of a unit superjunction U, and the vertical axis denotes electric field intensity of the high-voltage semiconductor device. Also, an area under the electric field intensity curve and the depth of a unit superjunction U corresponds to the breakdown voltage of the high-voltage semiconductor device.

The simulated high-voltage semiconductor device includes the unit superjunction U as shown in FIG. 2A, which has a width W of 4 μm and a height H of 40 μm. The critical width of an N-type pillar is 2 μm, and the thickness of a charge compensation layer is 0.5 μm. The dopant concentration of each of the pillars and a charge compensation plug is $4 \times 10^{15}/cm^3$, and the dopant concentration of the charge compensation layer is $2.8 \times 10^{16}/cm^3$.

FIGS. 5A through 5D illustrate variations of charge intensity when the angle δ of the first trench $T_a$ is 90°, 89.5°, 89°, and 88.5°, respectively. As FIGS. 5A through 5D illustrate, even if the angle δ of the first trench $T_a$ decreases, a variation of electric field intensity with respect to the depth of the unit superjunction U is substantially constant due to the fact that the balance of the amounts of charges can be maintained in the unit superjunction U so that the unit superjunction U may be completely depleted in a turn-off sate of the high-voltage semiconductor device and the unit superjunction U substantially functions as an insulator. Therefore, in the high-voltage semiconductor device according to the embodiments of the present invention, a breakdown voltage (e.g., ranging from 743 to 759 V) is made substantially insensitive to the angle δ of the trench $T_a$.

Also, referring to FIGS. 5A through 5D, it can be observed that the electric field intensity of the high-voltage semiconductor device sharply increased at a depth of about 40 μm due to the charge compensation layer covering the bottom surface of the trench $T_a$. For this effect, the present invention provides a bypass for excess avalanche current caused by the unclamped inductive switching (UIS) characteristics of the high-voltage semiconductor device, thus enhancing the reliability of the high-voltage semiconductor device.

Referring to FIGS. 6A and 6B, unlike the high-voltage semiconductor device according to the embodiments of the present invention, as the angle δ of the trench $T_a$ is decreased from 90° to 88.5° and the depth of the unit superjunction U is increased, the electric field intensity rapidly decreased, which was caused by a failure in the charge balance when the angle δ of the trench $T_a$ was less than 90°, and it can be understood that negative charges relatively increased and the electric field intensity decreased, as the depth increased. As a result, the breakdown voltage of a high-voltage semiconductor device including the intrinsic semiconductor layer was greatly reduced.

In a high-voltage semiconductor device according to the present invention, the balance of the amounts of charges can be always maintained in a depthwise direction of a unit superjunction due to a charge compensation plug, irrespective of the angle of a sidewall of a pillar or an inner wall of a trench with respect to a horizontal direction of a semiconductor layer. As a consequence, even if a sidewall of the trench for defining the pillar is not formed at an angle of 90°, the high-voltage semiconductor device can obtain a high breakdown voltage.

Furthermore, in a method of fabricating the high-voltage semiconductor device according to the present invention, an inner wall of a trench can be made to be lower than 90° to improve the reliability of a process of forming a charge compensation impurity layer and a process of forming the charge compensation plug and thus, facilitate the fabrication of the high-voltage semiconductor device.

While the present invention has been particularly shown and described with reference to exemplary embodiments thereof, it will be understood by one of ordinary skill in the art that various changes in form and details may be made therein without departing from the spirit and scope of the present invention as defined by the following claims. For example, although the invention is described in the context of planar gate field effect transistors, the invention is not limited as such. That is, the above-described charge balance techniques and their variations may be similarly implemented in other types of devices such as N-channel or P-channel trench gate MOSFETs or trench gate IGBTs (where the gate electrode is formed in a trench) and N-channel or P-channel shielded gate MOSFETs or shielded gate IGBTs (where both a gate electrode and an underlying shield electrode are formed in a trench). Also, in a high-voltage semiconductor device and a method of fabricating the same according to embodiments of the present invention, one or more annealing processes may be performed to activate impurity ions. As a result, the impurity ions may diffuse out so that boundaries of a charge compensation impurity layer and a charge compensation plug may move or become blurred. Therefore, the above description should not be taken as limiting the scope of the invention, which is defined by the appended claims.

What is claimed is:

1. A high-voltage semiconductor device comprising:
a semiconductor layer including a top surface, a bottom surface, and a plurality of pillars of a first conductivity type defined by a plurality of trenches, wherein the trenches extend from the top surface of the semiconductor layer toward the bottom surface thereof;
a charge compensation layer of a second conductivity type disposed over at least sidewalls of each trench to a predetermined thickness to form a groove in each trench; and
a charge compensation plug of the first conductivity type substantially filling each groove,
wherein sidewalls of each trench are slanted.

2. The device of claim 1, wherein the charge compensation layer also extends over a bottom surface of each trench.

3. The device of claim 1, wherein the first conductivity type is N type, and the second conductivity type is P type.

4. The device of claim 1, wherein the charge compensation layer is an epitaxially grown semiconductor layer.

5. The device of claim 1, wherein the charge compensation plug is an epitaxially grown semiconductor layer.

6. The device of claim 1, wherein the sum of the amount of charges in the pillars and in the charge compensation plugs is substantially equal to the amount of charges in the charge compensation layer in a depthwise direction of the grooves.

7. The device of claim 6, wherein the pillars and the charge compensation plugs substantially have the same first dopant concentration, and the charge compensation layer has a second dopant concentration.

8. The device of claim 7, wherein the second dopant concentration is higher than the first dopant concentration.

9. The device of claim 1, wherein the trenches have a stripe shape.

10. The device of claim 1, wherein the trenches extend to the bottom surface of the semiconductor layer.

11. The device of claim 1, further comprising an impurity layer disposed under the trenches and the pillars in the semiconductor layer.

12. The device of claim 1, further comprising a plurality of wells of the second conductivity type disposed adjacent to the top surface of the semiconductor layer, wherein the wells form PN junctions with the charge compensation plugs and the pillars.

13. The device of claim 12, further comprising a plurality of source regions of a first conductivity type disposed in the wells adjacent to the top surface of the semiconductor layer.

14. The device of claim 13, further comprising a plurality of gate stacks each laterally extending over a top surface of a corresponding well and a top surface of a corresponding pillar such that an underlying region of the corresponding well forms a channel between a source region and the corresponding pillar, wherein each gate stack includes a gate insulating layer and a gate electrode layer.

15. The device of claim 1 wherein the charge compensation layer forms a PN junction with an adjacent pillar.

16. A high-voltage semiconductor device comprising:
a semiconductor layer including a top surface, a bottom surface;
a plurality of trenches in the semiconductor layer, each adjacent pair of trenches defining a mesa region therebetween;
a pillar of a first conductivity type in each mesa region between every two adjacent trenches;
a charge compensation impurity layer of a second conductivity type vertically extending in each mesa region between each pillar and an adjacent trench sidewall; and
a charge compensation plug of the first conductivity type substantially filling each trench,
wherein sidewalls of each trench are slanted.

17. The device of claim 16, wherein the sum of the amount of charges in the pillars and the charge compensation plugs is substantially equal to the amount of charges in the charge compensation impurity layer in a depthwise direction of the trenches.

18. The device of claim 17, wherein the pillars and the charge compensation plugs have substantially the same first dopant concentration, and the charge compensation impurity layer has a second dopant concentration.

19. The device of claim 18, wherein the second dopant concentration is higher than the first dopant concentration.

20. The device of claim 16, further comprising:
a plurality of wells of the second conductivity type disposed adjacent to the top surface of the semiconductor layer, wherein the wells form PN junctions with the charge compensation plugs and the pillars;
a plurality of source regions of the first conductivity type disposed in the wells adjacent to the top surface of the semiconductor layer; and
a plurality of gate stacks each laterally extending over a top surface of a corresponding well and a top surface of a corresponding pillar such that an underlying region of each corresponding well forms a channel between a source region and a corresponding pillar, wherein each gate stack includes a gate insulating layer and a gate electrode layer.

21. The device of claim 16 wherein the charge compensation layer forms a PN junction with an adjacent pillar.

22. A high-voltage semiconductor device comprising:
a semiconductor layer including a top surface, a bottom surface, and a plurality of pillars of a first conductivity type defined by a plurality of trenches, wherein the trenches extend from the top surface of the semiconductor layer toward the bottom surface thereof;
a charge compensation layer of a second conductivity type disposed over at least sidewalls of each trench to a predetermined thickness to form a groove in each trench; and
a charge compensation plug of the first conductivity type substantially filling each groove,
wherein the sum of the amount of charges in the pillars and in the charge compensation plugs is substantially equal to the amount of charges in the charge compensation layer in a depthwise direction of the grooves.

23. The device of claim 22, wherein the charge compensation layer also extends over a bottom surface of each trench.

24. The device of claim 22, wherein sidewalls of each trench are slanted.

25. The device of claim 22, wherein the first conductivity type is N type, and the second conductivity type is P type.

26. The device of claim 22, wherein the charge compensation layer is an epitaxially grown semiconductor layer.

27. The device of claim 22, wherein the charge compensation plug is an epitaxially grown semiconductor layer.

28. The device of claim 22, wherein the pillars and the charge compensation plugs substantially have the same first dopant concentration, and the charge compensation layer has a second dopant concentration.

29. The device of claim 28, wherein the second dopant concentration is higher than the first dopant concentration.

30. The device of claim 22, wherein the trenches have a stripe shape.

31. The device of claim 22, wherein the trenches extend to the bottom surface of the semiconductor layer.

32. The device of claim 22, further comprising an impurity layer disposed under the trenches and the pillars in the semiconductor layer.

33. The device of claim 22, further comprising a plurality of wells of the second conductivity type disposed adjacent to the top surface of the semiconductor layer, wherein the wells form PN junctions with the charge compensation plugs and the pillars.

34. The device of claim 33, further comprising a plurality of source regions of a first conductivity type disposed in the wells adjacent to the top surface of the semiconductor layer.

35. The device of claim 34, further comprising a plurality of gate stacks each laterally extending over a top surface of a corresponding well and a top surface of a corresponding pillar such that an underlying region of the corresponding well forms a channel between a source region and the corresponding pillar, wherein each gate stack includes a gate insulating layer and a gate electrode layer.

36. The device of claim 22 wherein the charge compensation layer forms a PN junction with an adjacent pillar.

37. A high-voltage semiconductor device comprising:
a semiconductor layer including a top surface, a bottom surface;
a plurality of trenches in the semiconductor layer, each adjacent pair of trenches defining a mesa region therebetween;
a pillar of a first conductivity type in each mesa region between every two adjacent trenches;
a charge compensation impurity layer of a second conductivity type vertically extending in each mesa region between each pillar and an adjacent trench sidewall; and
a charge compensation plug of the first conductivity type substantially filling each trench,
wherein the sum of the amount of charges in the pillars and the charge compensation plugs is substantially equal to the amount of charges in the charge compensation impurity layer in a depthwise direction of the trenches.

38. The device of claim 37, wherein sidewalls of each trench are slanted.

39. The device of claim 37, wherein the pillars and the charge compensation plugs have substantially the same first dopant concentration, and the charge compensation impurity layer has a second dopant concentration.

40. The device of claim 39, wherein the second dopant concentration is higher than the first dopant concentration.

41. The device of claim 37, further comprising:
a plurality of wells of the second conductivity type disposed adjacent to the top surface of the semiconductor layer, wherein the wells form PN junctions with the charge compensation plugs and the pillars;
a plurality of source regions of the first conductivity type disposed in the wells adjacent to the top surface of the semiconductor layer; and
a plurality of gate stacks each laterally extending over a top surface of a corresponding well and a top surface of a corresponding pillar such that an underlying region of each corresponding well forms a channel between a source region and a corresponding pillar, wherein each gate stack includes a gate insulating layer and a gate electrode layer.

42. The device of claim 37 wherein the charge compensation layer forms a PN junction with an adjacent pillar.

* * * * *